(12) United States Patent
Kato

(10) Patent No.: US 11,854,925 B2
(45) Date of Patent: Dec. 26, 2023

(54) SEMICONDUCTOR DEVICE AND METHOD OF MANUFACTURING SEMICONDUCTOR DEVICE

(71) Applicant: Kioxia Corporation, Tokyo (JP)

(72) Inventor: Satoshi Kato, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 152 days.

(21) Appl. No.: 17/468,372

(22) Filed: Sep. 7, 2021

(65) Prior Publication Data

US 2022/0270945 A1 Aug. 25, 2022

(30) Foreign Application Priority Data

Feb. 25, 2021 (JP) .................................. 2021-028130

(51) Int. Cl.
*H01L 23/48* (2006.01)
*H01L 23/31* (2006.01)
(Continued)

(52) U.S. Cl.
CPC ........ *H01L 23/315* (2013.01); *H01L 21/4839* (2013.01); *H01L 21/56* (2013.01); *H01L 23/49816* (2013.01); *H01L 23/49822* (2013.01); *H01L 23/49838* (2013.01); *H01L 23/49866* (2013.01); *H01L 24/48* (2013.01); *H01L 25/0657* (2013.01); *H01L 2224/48235* (2013.01); *H01L 2225/0651* (2013.01); *H01L 2225/06562* (2013.01); *H01L 2924/1431* (2013.01); *H01L 2924/1443* (2013.01); *H01L 2924/182* (2013.01)

(58) Field of Classification Search
CPC ... H01L 23/315; H01L 25/0657; H01L 24/48; H01L 2225/0651; H01L 2224/48235
USPC .......................................................... 257/690
See application file for complete search history.

(56) References Cited

U.S. PATENT DOCUMENTS 6,376,904 B1 * 4/2002 Haba .................... H01L 23/3128
257/691
7,969,006 B2 * 6/2011 Lin ...................... H01L 23/5283
257/773
(Continued)

FOREIGN PATENT DOCUMENTS

JP 2009043877 A 2/2009
JP 2013175585 A 9/2013
(Continued)

*Primary Examiner* — Nitin Parekh
(74) *Attorney, Agent, or Firm* — Holtz, Holtz & Volek PC

(57) ABSTRACT

According to one embodiment, a semiconductor device includes a plurality of stacked semiconductor chips each of which has a first surface having an electrode formed thereon, a plurality of wires each of which has one end portion connected to each of the electrodes of the plurality of semiconductor chips and extends in a stacking direction of the semiconductor chips, a sealing resin that covers the plurality of semiconductor chips, has a second surface having recesses formed therein, and is formed so that the other end portions of the plurality of wires and the recesses overlap each other when viewed from the stacking direction, and a plurality of terminals that is provided so as to fill the recesses, each of which has one end portion connected to the other end portion of each of the plurality of wires and has the other end portion exposed from the sealing resin.

16 Claims, 9 Drawing Sheets

(51) Int. Cl.
  *H01L 23/00*       (2006.01)
  *H01L 23/498*      (2006.01)
  *H01L 21/48*       (2006.01)
  *H01L 21/56*       (2006.01)
  *H01L 25/065*      (2023.01)

(56) References Cited

U.S. PATENT DOCUMENTS

| | | | | |
|---|---|---|---|---|
| 8,198,717 | B1* | 6/2012 | Schenck | H01L 25/0657 |
| | | | | 257/E23.141 |
| 8,525,349 | B2* | 9/2013 | Song | H01L 24/49 |
| | | | | 438/109 |
| 8,710,675 | B2* | 4/2014 | Kim | H01L 25/0657 |
| | | | | 438/666 |
| 8,952,516 | B2 | 2/2015 | Zohni et al. | |
| 9,385,094 | B2* | 7/2016 | Tang | H01L 21/50 |
| 9,589,930 | B2* | 3/2017 | Park | H01L 24/49 |
| 9,761,568 | B2 | 9/2017 | Fang et al. | |
| 10,262,972 | B2* | 4/2019 | Lee | H01L 25/0652 |
| 10,522,489 | B1* | 12/2019 | Takiar | H01L 24/80 |
| 2002/0011666 | A1* | 1/2002 | Tandy | H05K 3/243 |
| | | | | 257/772 |
| 2002/0096755 | A1* | 7/2002 | Fukui | H01L 24/32 |
| | | | | 257/E21.705 |
| 2004/0245652 | A1* | 12/2004 | Ogata | H01L 24/03 |
| | | | | 257/E21.705 |
| 2013/0100616 | A1 | 4/2013 | Zohni et al. | |
| 2017/0186737 | A1 | 6/2017 | Fang et al. | |
| 2018/0174996 | A1 | 6/2018 | Mostovoy et al. | |

FOREIGN PATENT DOCUMENTS

| | | |
|---|---|---|
| TW | 201423954 A | 6/2014 |
| TW | 201724447 A | 7/2017 |

\* cited by examiner

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from Japanese Patent Application No. 2021-028130, filed on. Feb. 25, 2021; the entire contents of which are incorporated herein by reference.

FIELD

Embodiments described herein relate generally to a semiconductor device and a method of manufacturing a semiconductor device.

BACKGROUND

There is a semiconductor device in which a plurality of semiconductor chips is sealed. The semiconductor chips are stacked so as not to overlap electrodes formed on surfaces of the semiconductor chips. From each of the electrodes, a plurality of wires extends inside a sealing resin in a stacking direction of the semiconductor chips. The plurality of wires is connected to a build-up layer, a printed circuit board, or the like, on a surface side of the sealing resin.

In a manufacturing process of the semiconductor device, in order to connect the plurality of wires to the build-up layer, the printed circuit board, or the like, for example, the sealing resin is polished to expose the wires from the surface of the sealing resin.

DETAILED DESCRIPTION

In general, according to one embodiment, a semiconductor device includes a plurality of stacked semiconductor chips each of which has a first surface having an electrode formed thereon, a plurality of wires each of which has one end portion connected to each of the electrodes of the plurality of semiconductor chips and extends in a stacking direction of the semiconductor chips, a sealing resin that covers the plurality of semiconductor chips, has a second surface having recesses formed therein, and is formed so that the other end portions of the plurality of wires and the recesses overlap each other when viewed from the stacking direction, and a plurality of terminals that is provided so as to fill the recesses, each of which has one end portion connected to the other end portion of each of the plurality of wires and has the other end portion exposed from the sealing resin.

Exemplary embodiments of the present invention will be described below in detail with reference to the accompanying drawings. The present invention is not limited to the following embodiments. Furthermore, component elements in the following embodiments include component elements that are readily conceivable by a person skilled in the art or that are substantially identical.

First Embodiment

Hereinafter, a first embodiment will be described in detail with reference to the drawings.

Configuration Example of Semiconductor Device

Figure 1A:
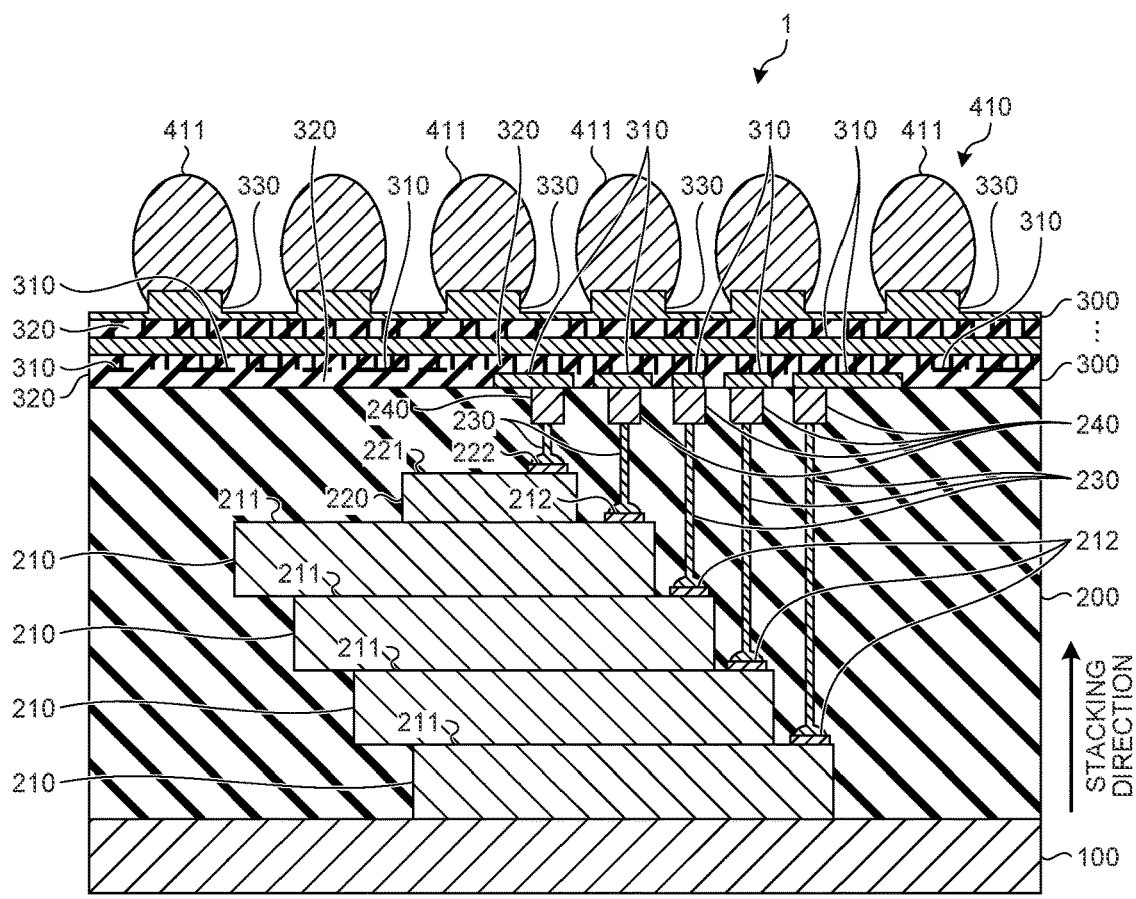
FIGS. 1A and 1B are diagrams each illustrating an example of a configuration of a semiconductor device according to a first embodiment.
Figure 1B:
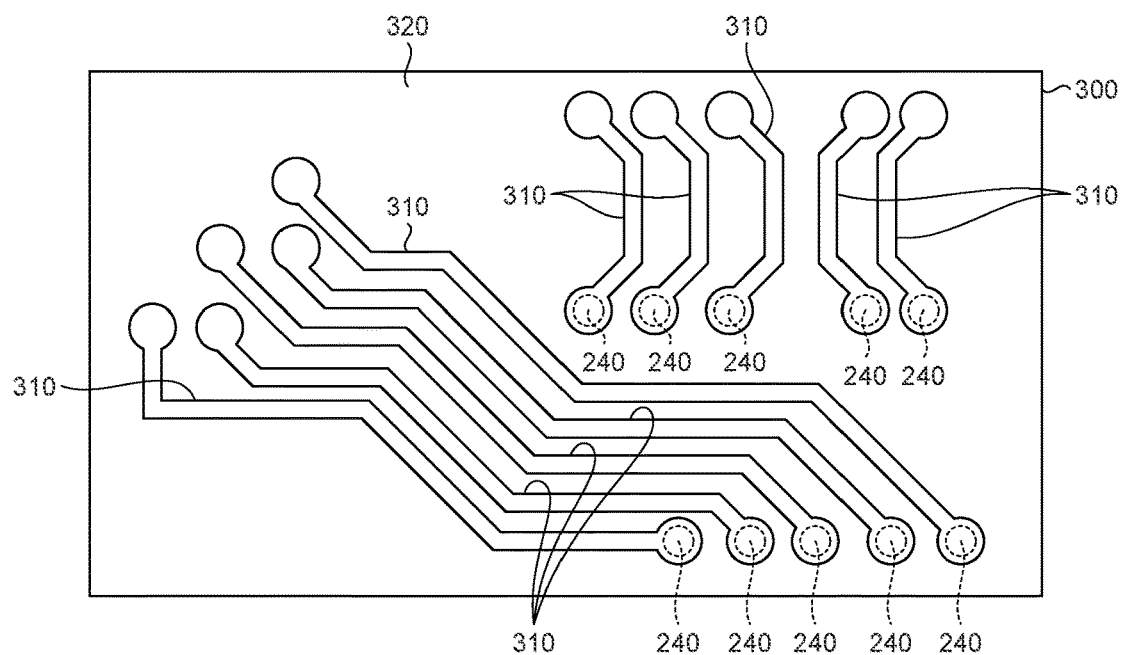

FIGS. 1A and 1B are diagrams each illustrating an example of a configuration of a semiconductor device 1 according to the first embodiment. FIG. 1A is a cross-sectional view of the semiconductor device 1, and FIG. 1B is a plan view of a build-up layer 300 included in the semiconductor device 1.

Note that in the present specification, the side of a lead frame 100 of the semiconductor device 1 is located below, and the side of a ball grid array 410 of the semiconductor device 1 is located above. Furthermore, a direction from the lower side to the upper side of the semiconductor device 1 is referred to as a stacking direction of semiconductor chips 210 and 220.

As illustrated in FIG. 1A, the semiconductor device 1 according to the first embodiment includes the lead frame 100, a sealing resin 200, a plurality of semiconductor chips 210 and 220, a plurality of build-up layers 300, and the ball grid array 410.

The lead frame 100 is a thin metal plate made of a metal such as Fe, Cu, Ni, Si, or Mg, or an alloy including at least one of these metals. The lead frame 100 has a thickness of, for example, approximately 23 µm. However, a flat plate-shaped member such as a Si substrate or a glass or stainless steel plate is usable instead of the lead frame 100, as long as the plate can serve as a support substrate when the plurality of semiconductor chips 210 and 220 is stacked.

Each of the plurality of semiconductor chips 210 has a major surface 211 on one surface side as a first surface on which an electrode 212 is formed. Each of the semiconductor chips 210 is, for example, a semiconductor chip having a nonvolatile memory on the side of the major surface 211 the same as the surface on which the electrode 212 is formed. In the semiconductor device 1, the major surface 211 faces upward, that is, faces a side opposite to the lead frame 100.

Each semiconductor chip 220 has a major surface 221 on one surface side as a first surface on which an electrode 222 is formed. Each semiconductor chip 220 has, for example, a logic circuit on the side of the major surface 221 the same as the surface on which the electrode 222 is formed. The logic circuit controls the nonvolatile memory included in the semiconductor chip 210. In the semiconductor device 1, the major surface 221 faces upward, that is, faces a side opposite to the lead frame 100.

The sealing resin 200 is a thermosetting resin such as an epoxy resin or an acrylic resin, and seals the plurality of semiconductor chips 210 and 220 arranged on the lead frame 100. The sealing resin 200 includes an inorganic filler such as glass.

At this time, the plurality of semiconductor chips 210 is sequentially staggered so that the electrodes 212 formed on the major surfaces 211 do not overlap each other.

The first semiconductor chip 210 on the lowermost side is arranged on the lead frame 100.

The second semiconductor chip 210 that is the second from the bottom is arranged on the major surface 211 of the first semiconductor chip 210, at a position slightly staggered in a horizontal direction from immediately above the first semiconductor chip 210. Thus, the second semiconductor chip 210 is stacked on the first semiconductor chip 210 without overlapping the electrode 212 of the first semiconductor chip 210.

The third semiconductor chip 210 that is the third from the bottom is arranged on the major surface 211 of the second semiconductor chip 210, at a position further staggered in the same direction as that of the second semiconductor chip 210 from immediately above the second semiconductor chip 210. Thus, the third semiconductor chip 210 is stacked on the second semiconductor chip 210 without overlapping the electrodes 212 of the first and second semiconductor chips 210.

Thereafter, the same applies to the fourth semiconductor chip 210 that is the fourth from the bottom. Note that the semiconductor device 1 has any number of semiconductor chips 210 and any number of stacked layers.

The semiconductor chip 220 is arranged on a semiconductor chip 210 that is the fourth semiconductor chip 210 located at the uppermost position so as not to overlap the electrode 212 of that semiconductor chip 210, in the example of FIG. 1A. Here, the semiconductor chip 220 has a chip area, for example, smaller than the plurality of semiconductor chips 210. Therefore, for example, the semiconductor chip 220 is allowed to be stacked so as not to protrude from the major surface 211 of the semiconductor chip 210 arranged immediately below the semiconductor chip 220 and so as not to overlap the electrode 212 of the semiconductor chip 210, on the semiconductor chip 210.

However, some or all of the plurality of semiconductor chips 210 may have different chip areas. In this configuration, the semiconductor chips 210 may be stacked from the side of the lead frame 100, in a descending order of the chip area. Thus, some or all of the semiconductor chips 210 may be stacked so as not to protrude from the major surfaces 211 of the lower semiconductor chips 210 and so as not to overlap the respective electrodes 212.

The plurality of semiconductor chips 210 and 220 has major surfaces on the other surface sides to which an adhesive or the like is applied, and is bonded to the lower lead frame 100 or major surfaces 211 of the lower semiconductor chips 210. The adhesive may use, for example, a die attach film (DAF).

Note that the semiconductor chips 210 and 220 each have a thickness of, for example, approximately 30 µm to 40 µm. In addition, depending on the number of semiconductor chips 210 and 220 stacked, the thickness of the sealing resin 200 entirely sealing the semiconductor chips 210 and 220 is, for example, approximately 700 µm.

From each of the electrodes 212 and 222 of the plurality of semiconductor chips 210 and 220, a plurality of wires 230 extends from the inside of the sealing resin 200 toward a surface of the sealing resin 200 in the stacking direction of the semiconductor chips 210 and 220. In other words, the plurality of wires 230 extends substantially vertically toward the upper side of the sealing resin 200.

Intervals between the plurality of wires 230 are substantially equal to horizontal intervals between the electrodes 212 and 222 of the plurality of semiconductor chips 210 and 220, and each of the intervals is, for example, approximately 250 µm. Each of the wires 230 has a diameter of, for example, approximately 23 µm.

The plurality of wires 230 is mainly made of, for example, Au. However, the plurality of wires 230 may include a metal material of at least one of, for example, Au, CuPd, Cu, and Ag.

A plurality of terminals 240 is arranged at positions near an upper surface of the sealing resin 200, as a second surface, that is, near a surface on the opposite side from the lead frame 100 and corresponding to the plurality of wires 230. Each of the plurality of terminals 240 has one end portion that is buried in the sealing resin 200 and connected to each of the plurality of wires 230. Each of the plurality of terminals 240 has the other end portion that is exposed from the surface of the sealing resin 200.

Each terminal 240 has a horizontal cross-sectional shape of, for example, circular shape, elliptical shape, or the like. Each terminal 240 has a diameter of, for example, approximately 40 µm to 50 µm that is larger than the diameter of each wire 230. This configuration makes it possible to connect each wire 230 and each terminal 240 more reliably.

The plurality of terminals 240 is mainly made of, for example, Cu. However, the plurality of terminals 240 may include, for example, at least one metal material of Cu, Ni, Sn, Au, W, and Al.

Here, the plurality of terminals 240 may be mainly made of a metal material of the same kind as that of the plurality of wires 230, or may include a metal material of the same kind as that of the plurality of wires 230. Alternatively, the plurality of terminals 240 may be mainly made of a metal material different from that of the plurality of wires 230 or may include a metal material different from that of the plurality of wires 230.

The plurality of build-up layers 300 is arranged on the surface side of the sealing resin 200 on the opposite side from the lead frame 100. Each of the build-up layers 300 includes a redistribution layer 310 arranged in an insulating layer 320 made of a polyimide resin, epoxy resin, or the like. The redistribution layer 310 is mainly made of, for example, a metal material such as Cu. The redistribution layer 310 has a thickness of, for example, approximately 50 nm to 100 nm. The plurality of build-up layers 300 has a structure in which a plurality of redistribution layers 310 is stacked by stacking a plurality of insulating layers 320 having such redistribution layers 310.

The redistribution layer 310 provided on the lowermost surface of the plurality of build-up layers 300, that is, on the surface side of the sealing resin 200 is connected to upper ends of the plurality of terminals 240 exposed from the surface of the sealing resin 200. Thus, each of the electrodes 212 and 222 of the plurality of semiconductor chips 210 and 220 is able to be drawn out to the surface of the sealing resin 200 by each wire 230 and terminal 240 and further freely routed on the surface of each build-up layer 300 by each redistribution layer 310. This configuration is illustrated in FIG. 1B.

The build-up layer 300 illustrated in FIG. 1B is, for example, the lowermost build-up layer 300 of the plurality of build-up layers 300. As illustrated in FIG. 1B, in the lowermost build-up layer 300, the redistribution layer 310 extends in the insulating layer 320, and has one end portion that is connected to the terminal 240 and the other end portion that is arranged at another place of the build-up layer 300.

Note that a core layer, which is not illustrated, made of a polyimide resin, epoxy resin, or the like may be arranged at the center in a thickness direction of the plurality of build-up layers 300. In other words, some of the plurality of build-up layers 300 may be arranged on the lower surface side of the core layer, and some of the other build-up layers 300 may be arranged on the upper surface side of the core layer. Providing such a core layer makes it possible to further firmly support the whole semiconductor device 1.

On the uppermost surface of the plurality of build-up layers 300, that is, a surface on the opposite side from the sealing resin 200, a plurality of electrode pads 330 connected to the redistribution layer 310 is arranged.

The ball grid array 410 includes a plurality of solder balls 411 arranged in a grid pattern on the build-up layer 300. Each of the solder balls 411 is connected to each of the plurality of electrode pads 330 on the build-up layer 300 in the uppermost layer.

The semiconductor device 1 according to the first embodiment is able to be mounted on a motherboard such as a printed circuit board (PCB), via the ball grid array 410.

Figure 2A:
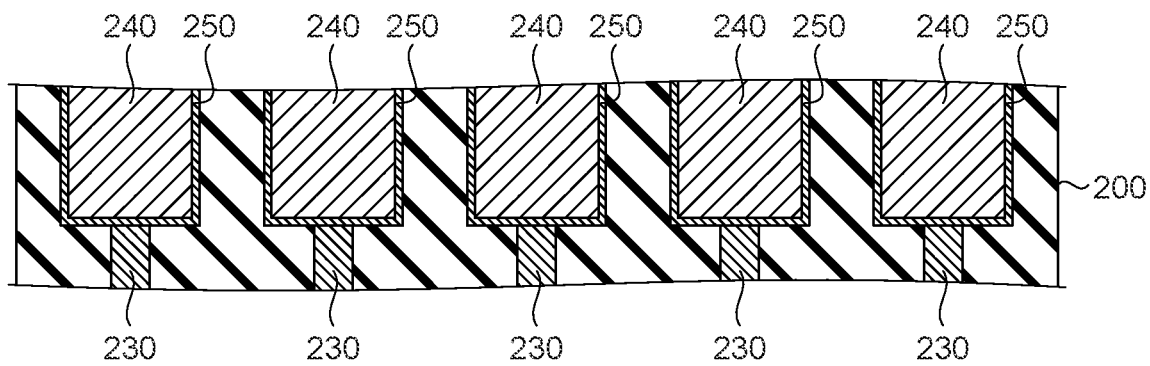
FIGS. 2A to 2C are cross-sectional views each exemplarily illustrating a detailed configuration of terminals included in the semiconductor device according to the first embodiment.
Figure 2B:
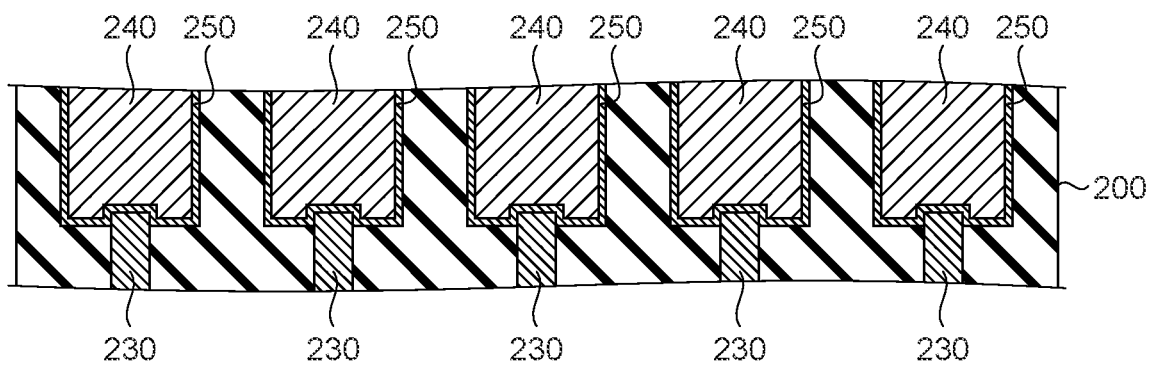
Figure 2C:
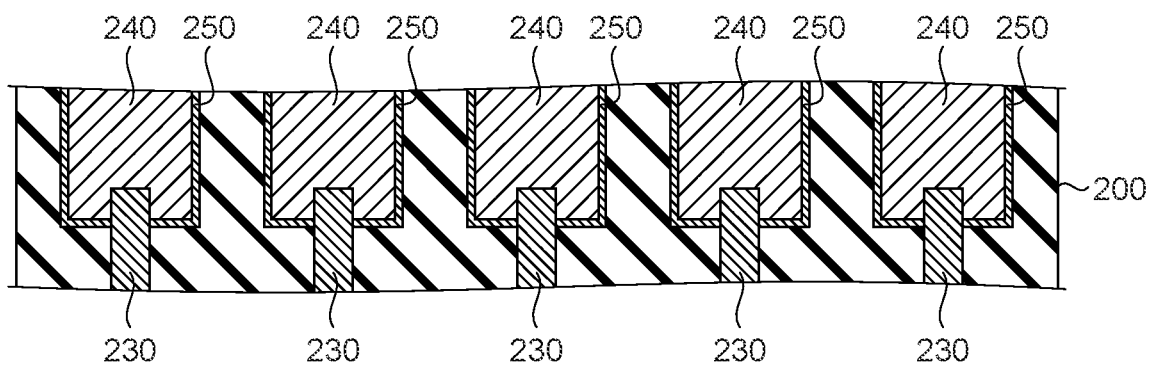

FIGS. 2A to 2C are cross-sectional views each exemplarily illustrating a detailed configuration of the terminals 240 included in the semiconductor device 1 according to the first embodiment. FIG. 2A is an example of a detailed configuration of the terminals 240, FIG. 2B is another example of a detailed configuration of the terminals 240, and FIG. 2C is still another example of a detailed configuration of the terminals 240.

As illustrated in FIGS. 2A to 2C, barrier layers 250 interposed between the sealing resin 200 and the plurality of terminals 240 are arranged at an interface between the sealing resin 200 and the plurality of terminals 240. In other words, each of the barrier layers 250 is arranged on side surfaces and a bottom surface of each terminal 240 buried in the sealing resin 200.

The barrier layer 250 as a metal-containing layer includes a metal material different from those of the plurality of wires and plurality of terminals to, for example, suppress diffusion of the Cu component of the terminal 240 mainly made of, for example, Cu or the like. Specifically, the barrier layer 250 is mainly made of, for example, TiN. However, the barrier layer 250 may include at least one of Ti, TiN, Ta, and TaN. The barrier layer 250 has a thickness of, for example, approximately several tens of nanometers to several hundreds of nanometers. The thickness of such an extent makes it possible to obtain the effect of suppressing the diffusion of Cu or the like.

Here, the plurality of terminals 240 is connected to the corresponding wires 230 of the plurality of wires 230 as described above.

In the example illustrated in FIG. 2A, each of the wires 230 extending in the sealing resin 200 in the stacking direction of the semiconductor chips 210 and 220 does not reach each of the terminals 240, but is in contact with the barrier layer 250 arranged at a lower end of the terminal 240. The barrier layer 250 is also conductive due to a metal content and the wire 230 is connected to the terminal 240 via the barrier layer 250.

In the example illustrated in FIG. 2B, each of the wires 230 extending in the sealing resin 200 in the stacking direction of the semiconductor chips 210 and 220 reaches a position slightly above the lower end of each terminal 240. However, the wire 230 extending in the terminal 240 is covered with the barrier layer 250. Therefore, also in this configuration, the wire 230 is connected to the terminal 240 via the barrier layer 250.

In the example illustrated in FIG. 2C, each of the wires 230 extending in the sealing resin 200 in the stacking direction of the semiconductor chips 210 and 220 penetrates the barrier layer 250 arranged at the lower end of each terminal 240 and reaches the inside of the terminal 240. In this configuration, the wire 230 is directly connected to the terminal 240 without passing through the barrier layer 250.

In the semiconductor device 1 according to the first embodiment, the wire 230 and the terminal 240 may be connected in any form of FIGS. 2A to 2C. Alternatively, as long as the wire 230 and the terminal 240 can be electrically connected, the semiconductor device 1 can take any form other than those of FIGS. 2A to 2C.

Method of Manufacturing Semiconductor Device

Next, a method of manufacturing the semiconductor device 1 according to the first embodiment will be described with reference to FIGS. 3A to 4E. FIGS. 3A to 4E are cross-sectional views illustrating an example of the procedure of the method of manufacturing the semiconductor device 1 according to the first embodiment.

Figure 3A:
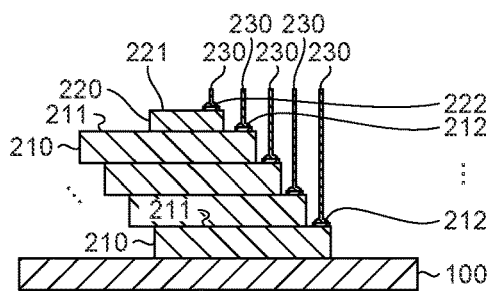
FIGS. 3A to 3H are cross-sectional views illustrating an example of a procedure of a method of manufacturing the semiconductor device according to the first embodiment.

As illustrated in FIG. 3A, the plurality of semiconductor chips 210 each having the major surface 211 on which the electrode 212 is formed is sequentially stacked on the major surfaces 211 so as not to overlap the electrodes 212 formed on the major surfaces 211. In other words, the first semiconductor chip 210 is secured on the lead frame 100 with an adhesive. Furthermore, the second, the third, . . . semiconductor chips 210 are sequentially secured on the major surfaces 211 of the lower semiconductor chips 210 with an adhesive while being staggered in the horizontal direction.

Furthermore, the semiconductor chip 220 having the major surface 221 on which the electrode 222 is formed is stacked on the major surface 211 of the semiconductor chip 210 in the uppermost layer of the plurality of stacked semiconductor chips 210 so as not to overlap the electrode 212 formed on the major surface 211 of the semiconductor chip 210. In other words, the semiconductor chip 220 is secured with the adhesive, on the major surface 211 of the semiconductor chip 210 in the uppermost layer that is the uppermost surface.

Furthermore, the plurality of wires 230 that extends from the respective electrodes 212 and 222 of the plurality of semiconductor chips 210 and 220, in the stacking direction of the semiconductor chips 210 and 220, is formed. The plurality of wires 230 can be formed of a metal material mainly made of, for example, Au, as described above. However, the plurality of wires 230 may be formed of a metal material of at least one of, for example, Au, CuPd, Cu, and Ag as described above.

At this time, the plurality of wires 230 reaches a position higher than the major surface 221 of the semiconductor chip 220 in the uppermost layer that is the uppermost surface. The plurality of wires 230 has end portions positioned on the opposite side from connection ends connected to the electrodes 212 and 222, and the positions of the end portions in the stacking direction are desirably substantially the same. In other words, the end portions of the plurality of wires 230 are desirably at substantially the same height position in a horizontal direction.

Here, the description "the end portions of the plurality of wires 230 are substantially at the same position" means that the positions of the end portions are substantially the same. The description "substantially the same" means, for example, that variations in the positions of these end portions are within the range of manufacturing error.

Figure 3B:
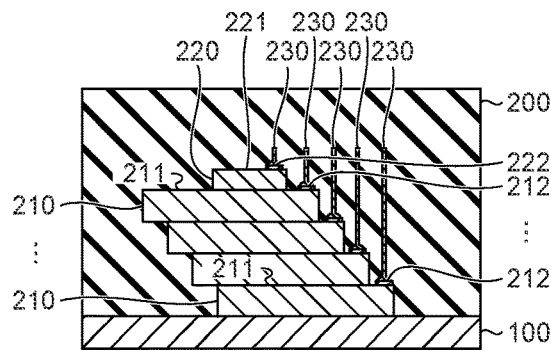

As illustrated in FIG. 3B, the plurality of semiconductor chips 210 and 220 and the plurality of wires 230 are sealed with the sealing resin 200. In other words, the lead frame 100 and the plurality of semiconductor chips 210 and 220 stacked on the lead frame 100 are put in a mold which is not illustrated, and the inside of the mold is filled with a thermosetting resin such as an epoxy resin. The entire mold is heated to cure the thermosetting resin. Thus, the plurality of semiconductor chips 210 and 220 and the plurality of wires 230 are sealed with the sealing resin 200.

At this time, the plurality of semiconductor chips 210 and 220 and the plurality of wires 230 are covered with the sealing resin 200 so that even the end portions of the wires 230 reaching above the semiconductor chip 220 are buried in the sealing resin 200. When the final thickness of the sealing resin 200 is, for example, approximately 700 μm as described above, the thickness of the sealing resin 200 at this time point is, for example, approximately 900 μm.

Figure 3C:
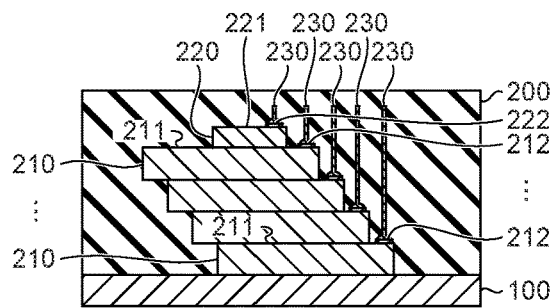

As illustrated in FIG. 3C, the upper surface of the sealing resin 200, that is, the surface opposite to a side on which the lead frame 100 is arranged is polished by, for example, a chemical mechanical polishing (CMP) method or the like. At this time, for example, slurry suitable for polishing a resin material such as the sealing resin 200 is used. Furthermore, at this time, the amount of sealing resin 200 polished is adjusted so that the thickness from the upper end portions of the plurality of wires 230 to the polished surface of the sealing resin 200 is approximately a few micrometers to 10 μm.

Figure 3D:
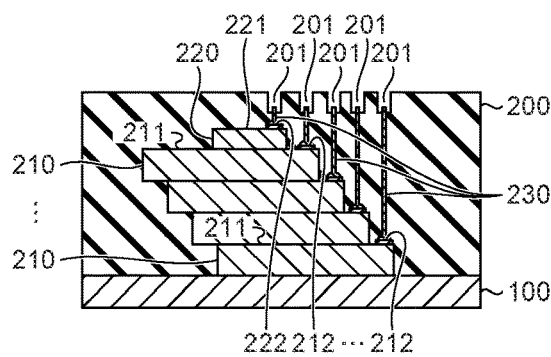

As illustrated in FIG. 3D, a plurality of recesses 201 is formed in the surface of the sealing resin 200 in the stacking direction at positions corresponding to the plurality of wires 230 to expose the end portions of the plurality of wires 230 from bottom surfaces of the plurality of recesses 201. Such a recess 201 can be formed by, for example, photolithography, etching, or the like.

In other words, a resist pattern, which is not illustrated, having a pattern of the recesses 201 is formed on the surface of the sealing resin 200. Furthermore, the sealing resin 200 is etched with the resist pattern as a mask. Thus, the plurality of recesses 201 is allowed to be formed in the surface of the sealing resin 200.

Here, for example, controlling an etching depth of each of the recesses 201 to be etched enables exposure of each of the end portions of the wires 230 from each of the bottom surfaces of the recesses 201. At this time, the amount of the wire 230 exposed from the bottom surface of the recess 201 changes according to the etching depth of the recess 201, and, for example, any of the states of FIGS. 2A to 2C described above can be obtained according to the subsequent processing.

Figure 3E:
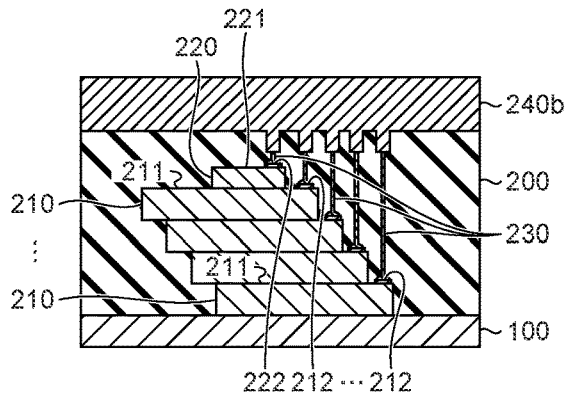
Figure 3F:
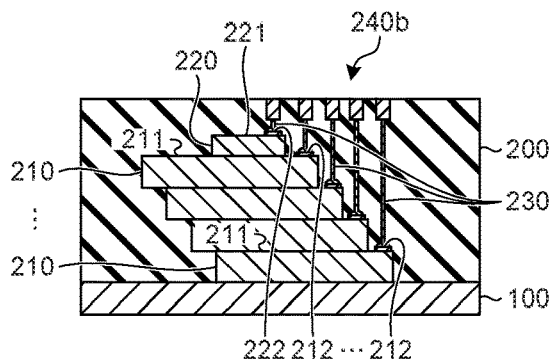
Figure 3G:
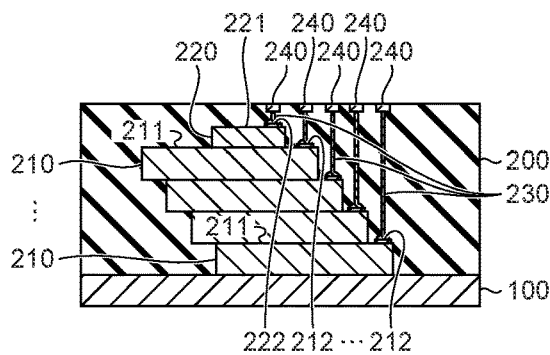

FIGS. 3E to 3G illustrate a state in which the plurality of recesses 201 is filled with a metal material to form the plurality of terminals 240 connected to the end portions of the plurality of wires 230. The processing illustrated in FIGS. 3E to 3G will be described in detail below.

As illustrated in FIG. 3E, a conductive layer 240b covering the entire surface of the sealing resin 200 is formed. The conductive layer 240b is formed by, for example, Cu plating or the like. Therefore, the conductive layer 240b is also filled in the plurality of recesses 201 formed in the surface of the sealing resin 200.

Here, the barrier layer 250 (see FIGS. 2A to 2C) including the metal material different from those of the plurality of wires 230 and plurality of terminals 240 is formed in advance in the plurality of recesses 201 in the sealing resin 200. Specifically, the barrier layer 250 is formed by, for example, a chemical vapor deposition (CVD) method, a sputtering method, or the like.

Therefore, the barrier layer 250 mainly made of, for example, TiN or the like is formed on the surface of the sealing resin 200 and the side surfaces and bottom surfaces of the plurality of recesses 201 formed in the surface of the sealing resin 200. However, the barrier layer 250 may be formed including, for example, at least one of Ti, TiN, Ta, and TaN as described above.

Note that the barrier layer 250 including any of the above materials is also formable by, for example, the sputtering method. However, the recess 201 in which the barrier layer 250 is formed is fine and an interval between the recesses 201 is narrow, and thus, it is preferable to form the barrier layer 250 by, for example, the CVD method or the like as described above.

After the barrier layer 250 is formed as described above, the conductive layer 240b is formed by the Cu plating or the like as described above, whereby the plurality of recesses 201 is filled with the metal material such as Cu via the barrier layers 250.

As illustrated in FIG. 3F, the conductive layer 240b is polished by, for example, the CMP method or the like. At this time, for example, slurry suitable for polishing the metal material such as Cu is used. Therefore, the conductive layer 240b formed on the sealing resin 200 is removed, and the conductive layer 240b filled in the recesses 201 via the barrier layers 250 remains. Note that at this time, the barrier layer 250 on the sealing resin 200 is also removed.

As illustrated in FIG. 3G, the surface of the sealing resin 200 is further polished by the CMP method or the like using, for example, the slurry suitable for polishing the resin material. Such polishing is called, for example, touch-up polishing or finish polishing.

Therefore, the conductive layer 240b in the recesses 201 of the sealing resin 200 is allowed to be more reliably exposed from the surface of the sealing resin 200. In addition, it is possible to inhibit the exposed surface of the conductive layer 240b from being recessed into a dished shape.

In order to perform such fine adjustment by the CMP method, an appropriate polishing time is preferably determined in advance by an experiment or the like to polish the sealing resin 200 in a fixed time.

Alternatively, the sealing resin 200 may be polished while measuring the distance of the polished surface from the major surface 221 of the semiconductor chip 220 that is the uppermost surface of the stacked semiconductor chips 210 and 220. The distance of the polished surface from the major surface 221 of the semiconductor chip 220 can be identified, for example, by detecting light reflected from the major surface 221 of the semiconductor chip 220.

The above configuration forms the plurality of terminals 240 that is mainly made of, for example, Cu, and having the upper ends exposed from the surface of the sealing resin 200 and the lower ends connected to the plurality of wires 230. However, the plurality of terminals 240 may be formed of, for example, at least one metal material of Cu, Ni, Sn, Au, W, and Al as described above.

At this time, the thickness of the sealing resin 200 is, for example, approximately 700 μm, as in the sealing resin 200 included in the semiconductor device 1 as a finished product.

FIGS. 3H to 4D illustrate a state where the build-up layer 300 in which the redistribution layer 310 connected to the plurality of terminals 240 is disposed is formed on the surface side of the sealing resin 200. The processing illustrated in FIGS. 3H to 4D will be described in detail below.

Figure 3H:
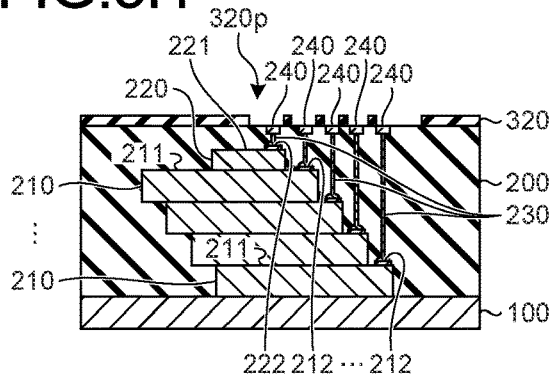

As illustrated in FIG. 3H, the insulating layer 320 made of the polyimide resin, epoxy resin, or the like and having a redistribution layer pattern 320p is formed on the upper surface of the sealing resin 200.

Figure 4A:
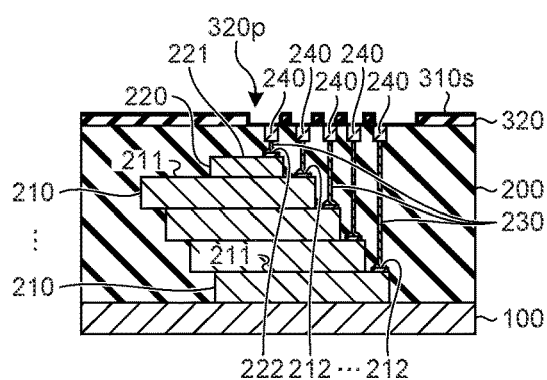
FIGS. 4A to 4E are cross-sectional views illustrating an example of the procedure of the method of manufacturing the semiconductor device according to the first embodiment.

As illustrated in FIG. 4A, a seed layer 310s is formed by, for example, electroless plating or the like, on the upper surface of the insulating layer 320, a side surface of the redistribution layer pattern 320p, the upper surface of the sealing resin 200 exposed from the redistribution layer pattern 320p, and upper surfaces of the plurality of terminals 240. The seed layer 310s is mainly made of, for example, a metal material such as Cu. However, the seed layer 310s may be formed by stacking a plurality of layers of a layer mainly made of Ti or the like in a lower layer and a layer mainly made of Cu or the like in an upper layer.

Figure 4E:
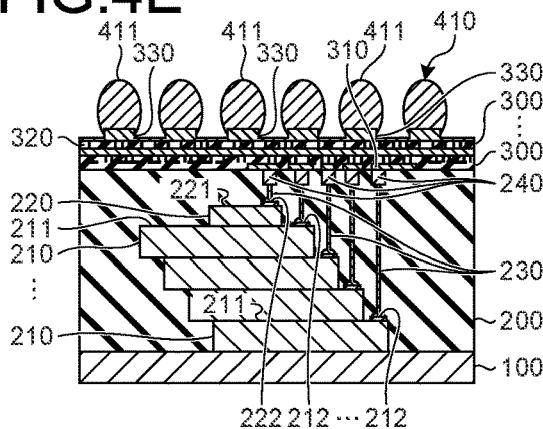
Figure 4B:
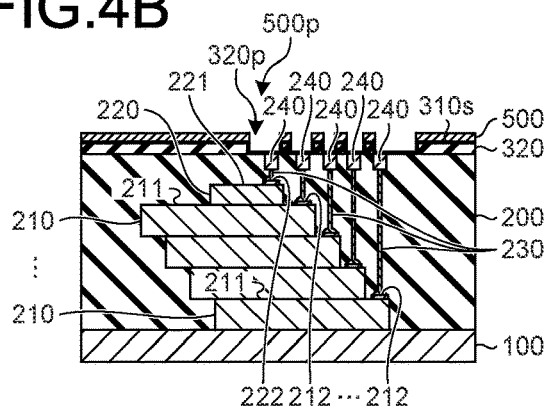

As illustrated in FIG. 4B, a resist pattern 500 is formed on the upper surface of the insulating layer 320 via the seed layer 310s. The resist pattern 500 has a redistribution layer pattern 500p at a position overlapping the redistribution layer pattern 320p in the insulating layer 320.

Figure 4C:
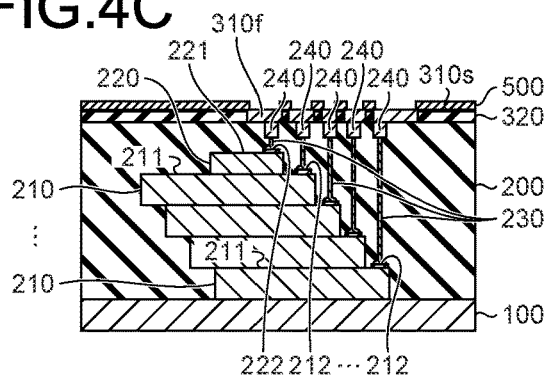

As illustrated in FIG. 4C, a conductive layer 310f mainly made of, for example, Cu or the like is selectively formed on the seed layer 310s exposed from the redistribution layer patterns 320p and 500p by Cu plating or the like. Therefore, the redistribution layer pattern 320p in the insulating layer 320 is filled with the conductive layer 310f.

Figure 4D:
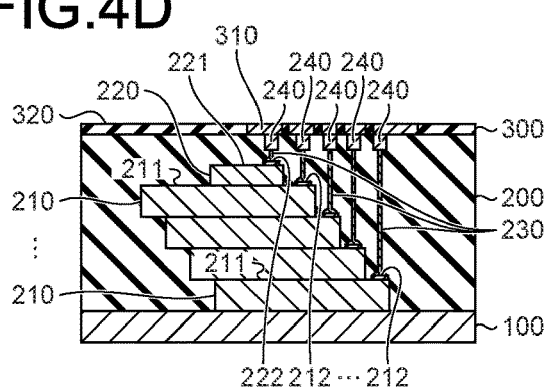

As illustrated in FIG. 4D, the resist pattern 500 and the seed layer 310s are removed from the upper surface of the insulating layer 320. The resist pattern 500 can be removed by ashing using, for example, oxygen plasma or the like. The seed layer 310s can be removed by, for example, wet etching using a chemical solution.

The above configuration forms the build-up layer 300 having the redistribution layer 310 connected to the plurality of terminals 240 and the insulating layer 320 on which the redistribution layer 310 is arranged. The build-up layer 300 formed here is the lowermost build-up layer 300 of the plurality of build-up layers 300.

As illustrated in FIG. 4E, the processing in FIGS. 3H to 4D is repeated to stack the plurality of build-up layers 300. Furthermore, the electrode pads 330 are formed on the upper surface of the uppermost build-up layer 300. In addition, the plurality of solder balls 411 connected to the electrode pads 330 is formed on the electrode pads 330, and the ball grid array 410 having the solder balls 411 arranged in the grid pattern is formed.

As described above, the semiconductor device 1 according to the first embodiment is manufactured.

Comparative Example

Figure 5A:
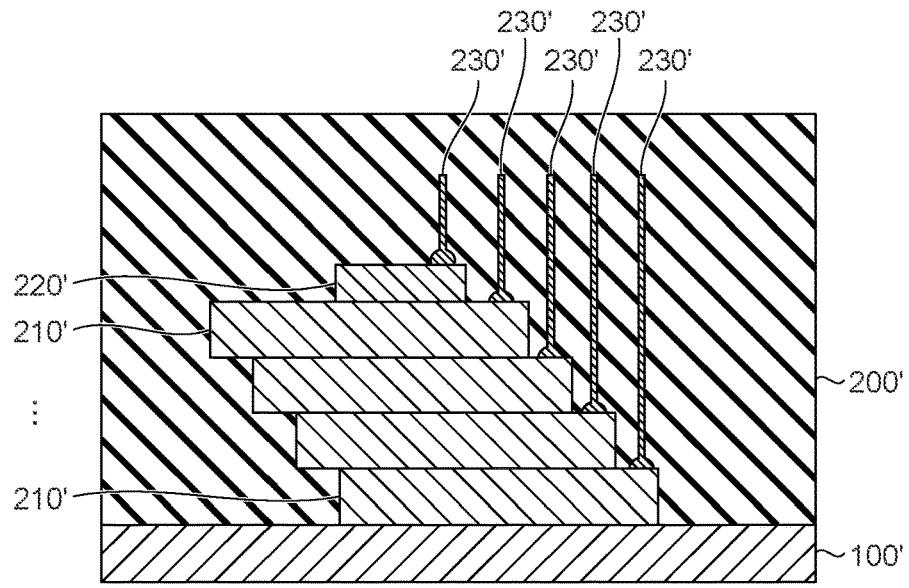
FIGS. 5A to 5C are cross-sectional views illustrating an example of a procedure of a method of manufacturing a semiconductor device according to a comparative example.
Figure 5B:
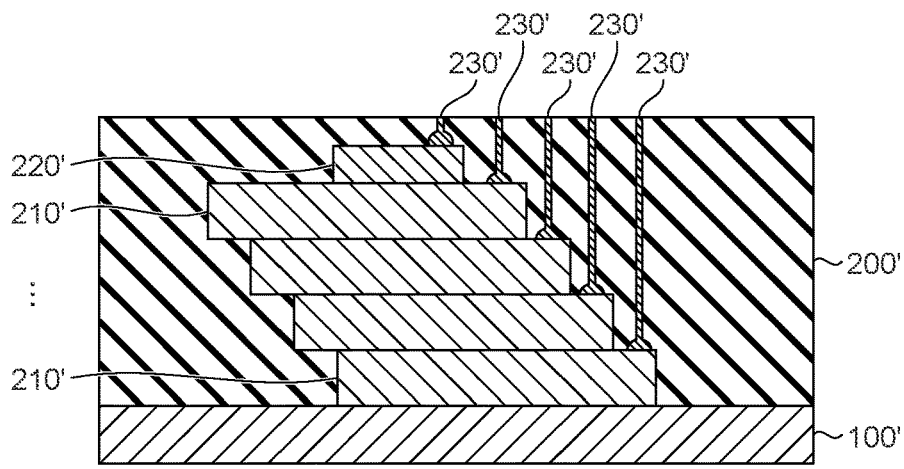
Figure 5C:
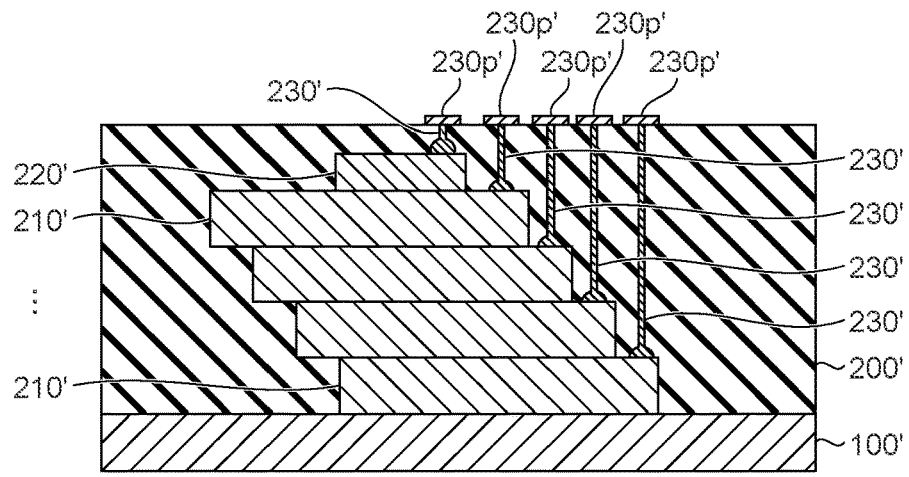

Next, a method of manufacturing a semiconductor device according to a comparative example will be described with reference to FIGS. 5A to 5C. FIGS. 5A to 5C are cross-sectional views illustrating an example of a procedure of the method of manufacturing the semiconductor device according to the comparative example.

As illustrated in FIG. 5A, a plurality of semiconductor chips 210' and 220' is stacked on a lead frame 100', and a plurality of wires 230' extending in a stacking direction of the semiconductor chips 210' and 220' from electrodes of the semiconductor chips 210' and 220' is formed. In addition, the plurality of semiconductor chips 210' and 220' and the plurality of wires 230' are sealed with a sealing resin 200'.

As illustrated in FIG. 5B, a surface of the sealing resin 200' is polished to expose end portions of the plurality of wires 230' from the surface of the sealing resin 200'. Note that even after the plurality of wires 230' is exposed, polishing of the sealing resin 200' and the plurality of wires 230' is continued for a predetermined period of time to expose the end portions of the plurality of wires 230' more reliably.

As illustrated in FIG. 5C, a plurality of electrode pads 230p' connected to the end portions of the plurality of wires 230' exposed from the surface of the sealing resin 200' is formed. The plurality of wires 230' is connected to a build-up layer, which is not illustrated, via the electrode pads 230p'.

In the semiconductor device 1 according to the first embodiment, even if the plurality of wires 230 is not extended to the vicinity of the surface of the sealing resin 200, the end portions of the wires 230 buried in the sealing resin 200 are connected to the terminals 240, thus, the wires 230 are able to be electrically drawn out to the surface of the sealing resin 200. Therefore, the original length of each wire 230 is allowed to be reduced relative to the layer thickness of the sealing resin 200, and distortion of the wire 230 in sealing can be suppressed. In addition, the diameter of each terminal 240 connected to the wire 230 does not need to be increased.

In the semiconductor device 1 according to the first embodiment, the sealing resin 200 and the wire 230 does not need to be polished together. Therefore, the flatness of the surface of the sealing resin 200 after polishing can be maintained. Accordingly, a connection failure between the wire 230 and the build-up layer 300 via the terminal 240 can be suppressed.

In the semiconductor device 1 according to the first embodiment, the wire 230 does not need to be polished, suppressing elongation of the wire 230. Therefore, a highly ductile metal material such as Au can also be selected as a constituent material of the wire 230. This configuration makes it possible to have more choices of the constituent material of the wire 230, facilitate the design of the semiconductor device 1, increasing the electrical characteristics of the semiconductor device 1.

Note that, in the embodiment described above, as in the electrode 212 of the semiconductor chip 210, the wire 230 is connected to the electrode 222 of the semiconductor chip 220. However, the semiconductor chip 220 is the uppermost chip and is closer in distance to the surface of the sealing resin 200. Therefore, a columnar metal member made of Cu or the like may be connected to the electrode 222 of the semiconductor chip 220, instead of the wire 230. Such a metal member is also called, for example, a metal pillar. The metal pillar may be formed by, for example, a plating method.

In addition, the semiconductor chip 220 may be a controller chip. At this time, in the controller chip, a pitch between the pads may be narrower than that in the semiconductor chips 210. The narrower pitch between the pads makes wire bonding difficult and thus, the plating method is selected to form the metal pillar. The metal pillar is formed on the controller chip before the controller chip is stacked on the semiconductor chip 210. However, the metal pillar may be formed after the controller chip is stacked on the semiconductor chip 210.

Furthermore, there may be a wire extending upward from the lead frame 100 and connected to the redistribution layer 310. At this time, a ground voltage or power supply voltage is supplied to the lead frame 100 from one solder ball 411 of the ball grid array 410. However, any other voltage may be supplied to the lead frame 100.

(First Modification)

Next, a semiconductor device 1a according to a first modification of the first embodiment will be described with reference to FIGS. 6A to 6D. The semiconductor device 1a according to the first modification is different from the semiconductor device according to the first embodiment described above in that terminals 242 and a redistribution layer 311 are collectively formed.

FIGS. 6A to 6D are cross-sectional views illustrating an example of a procedure of a method of manufacturing the semiconductor device 1a according to the first modification of the first embodiment. Prior to the processing in FIG. 6A, in the method of manufacturing the semiconductor device 1a according to the first modification, the processing illustrated in FIGS. 3A to 3C of the first embodiment described above is performed.

Figure 6A:
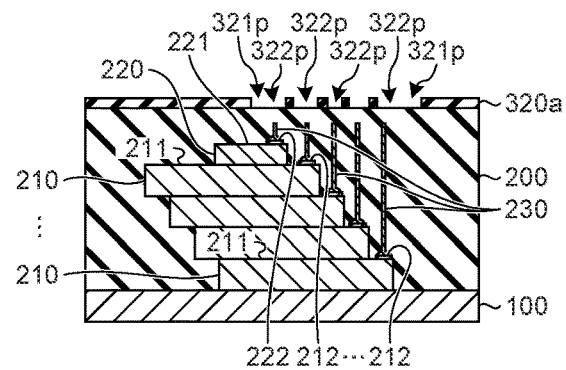
FIGS. 6A to 6D are cross-sectional views illustrating an example of a procedure of a method of manufacturing a semiconductor device according to a first modification of the first embodiment.
Figure 6B:
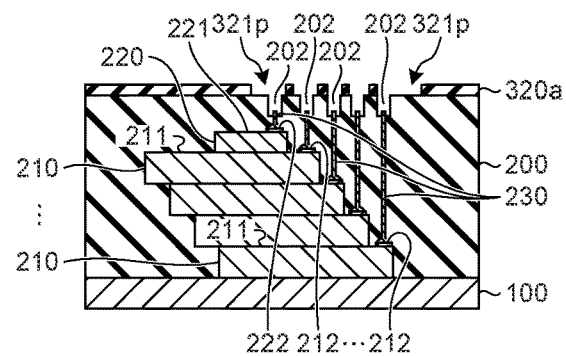

FIGS. 6A and 6B illustrate a state in which a plurality of recesses 202 is formed in the surface of the sealing resin 200.

As illustrated in FIG. 6A, an insulating layer 320a that covers the surface of the sealing resin 200 and has a redistribution layer pattern 321p and a recess pattern 322p is formed. The redistribution layer pattern 321p and the recess pattern 322p in the insulating layer 320a can be formed by, for example, photolithography, etching, or the like.

In other words, the insulating layer 320a before forming the redistribution layer pattern 321p and the recess pattern 322p is formed on the surface of the sealing resin 200. In addition, a resist pattern, which is not illustrated, having the redistribution layer pattern and the recess pattern is formed on the insulating layer 320a. Furthermore, the insulating layer 320a is etched with the resist pattern as a mask. This configuration makes it possible to form the redistribution layer pattern 321p and the recess pattern 322p in the insulating layer 320a.

As illustrated in FIG. 6B, the recess pattern 322p is transferred into the sealing resin 200 to form the plurality of recesses 202. The recess 202 can be transferred by, for example, photolithography, etching, or the like.

In other words, the resist pattern, which is not illustrated, having the recess pattern is formed on the insulating layer 320a at a position overlapping the recess pattern 322p in the insulating layer 320a. Furthermore, the sealing resin 200 is etched with the resist pattern as a mask. Thus, the plurality of recesses 202 is formed in the surface of the sealing resin 200. The wires 230 are exposed from the bottom surfaces of the plurality of recesses 202.

Figure 6C:
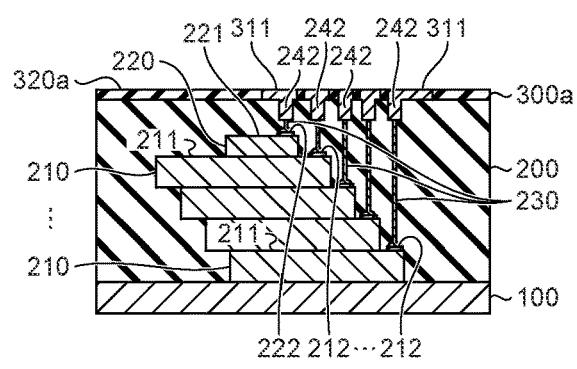

FIG. 6C illustrates a state in which the plurality of terminals 242 and the redistribution layers 311 are formed. In other words, the plurality of recesses 202 in the sealing resin 200 and the redistribution layer pattern 321p in the insulating layer 320a are collectively filled with the metal material. At this time, for example, the method of forming the redistribution layer 310 illustrated in FIGS. 4A to 4D of the first embodiment described above may be used.

The plurality of terminals 242 is formed of the metal material filled in the plurality of recesses 202. Furthermore, in parallel, the redistribution layer 311 is formed of the metal material filled in the redistribution layer pattern 321p in the insulating layer 320a.

The above configuration forms a build-up layer 300a having the redistribution layer 311 connected to the plurality of terminals 242 and the insulating layer 320a on which the redistribution layer 311 is arranged. The build-up layer 300a formed here is the lowermost build-up layer 300a.

Figure 6D:
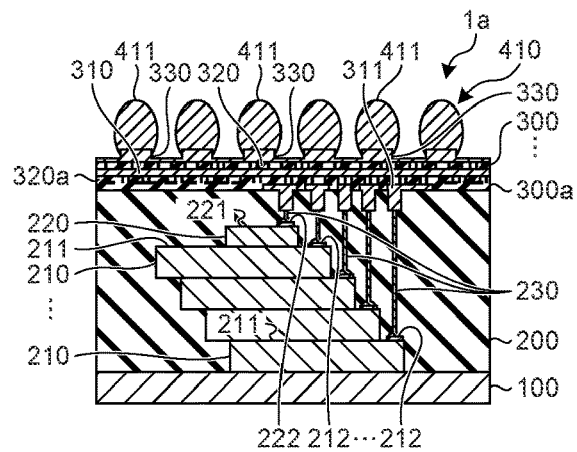

As illustrated in FIG. 6D, the processing illustrated in FIGS. 3H to 4D of the first embodiment described above is repeated to form a plurality of the build-up layers 300. This configuration forms the build-up layer 300 having the build-up layer 300a in the lowermost layer and having a plurality of layers stacked.

Furthermore, the electrode pads 330 are formed on the upper surface of the uppermost build-up layer 300. In addition, the plurality of solder balls 411 connected to the electrode pads 330 is formed on the electrode pads 330, and the ball grid array 410 having the solder balls 411 arranged in the grid pattern is formed.

As described above, the semiconductor device 1a according to the first modification is manufactured.

The semiconductor device 1a according to the first modification provides effects similar to those of the semiconductor device 1 according to the first embodiment described above.

In the method of manufacturing the semiconductor device 1a according to the first modification, the insulating layer 320a having the redistribution layer pattern 321p and the recess pattern 322p is formed, and the plurality of recesses 202 in the sealing resin 200 into which the recess pattern 322p is transferred and the redistribution layer pattern 321p in the insulating layer 320a are collectively filled with the metal material. This configuration makes it possible to collectively form the plurality of terminals 242 and the redistribution layer 311, enhancing the manufacturing efficiency of the semiconductor device 1a.

(Second Modification)

Next, a semiconductor device 1b according to a second modification of the first embodiment will be described with reference to FIGS. 7A and 7B. The semiconductor device 1b according to the second modification is different from the semiconductor device according to the first embodiment described above in that a printed circuit board 600 is provided instead of the plurality of build-up layers 300.

Figure 7A:
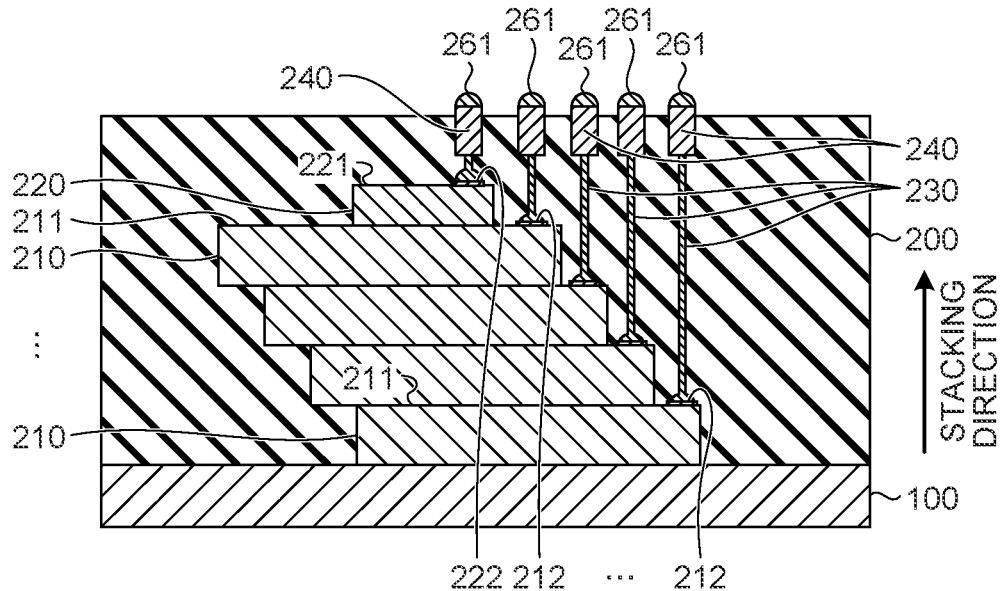
FIGS. 7A and 7B are cross-sectional views illustrating an example of a procedure of a method of manufacturing a semiconductor device according to a second modification of the first embodiment.
Figure 7B:
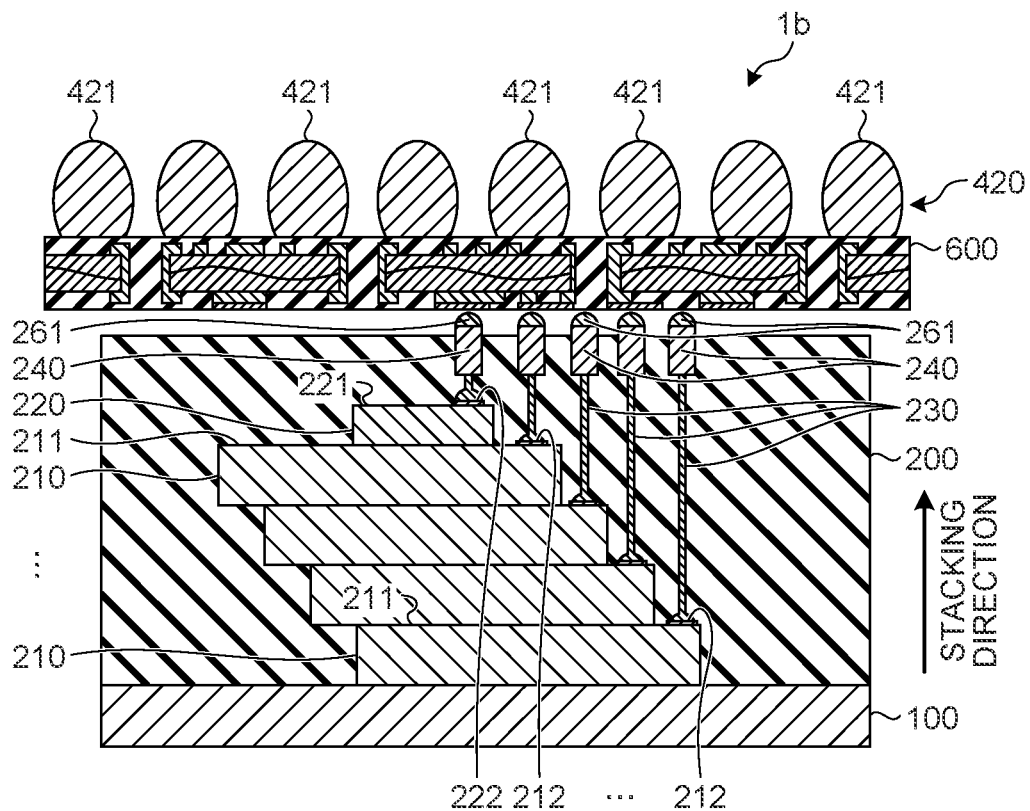

FIGS. 7A and 7B are cross-sectional views illustrating an example of a procedure of a method of manufacturing the semiconductor device 1b according to the second modification of the first embodiment. Prior to the processing in FIG. 7A, in the method of manufacturing the semiconductor device 1b according to the second modification, the processing illustrated in FIGS. 3A to 3G of the first embodiment described above is performed.

FIG. 7A illustrates a state in which a plurality of bumps 261 is formed on the plurality of terminals 240. In other words, the plurality of bumps 261 is formed at the upper ends of the plurality of terminals 240 exposed from the polished surface that is the surface of the sealing resin 200.

As illustrated in FIG. 7B, the printed circuit board 600 is arranged on the surface side of the sealing resin 200 so as to be connected to the plurality of bumps 261. The printed circuit board (PCB) 600 as a wiring board is a premade package substrate in which various kinds of wiring are formed on a base material made of, for example, a polyimide resin or epoxy resin.

A plurality of solder balls 421 is formed into a grid pattern on the printed circuit board 600 to form a ball grid array 420 including the plurality of solder balls 421. The semiconductor device 1b according to the second modification is mounted on the motherboard such as another printed circuit board, via the ball grid array 420.

As described above, the semiconductor device 1b according to the second modification is manufactured.

In this way, the semiconductor device 1b according to the second modification includes the printed circuit board 600 arranged on the surface side of the sealing resin 200. Furthermore, the upper ends of the plurality of terminals 240 are connected to the printed circuit board 600 via the plurality of bumps 261.

The semiconductor device 1b according to the second modification provides effects similar to those of the semiconductor device 1 according to the first embodiment described above.

In the method of manufacturing the semiconductor device 1b according to the second modification, the semiconductor device 1b including the printed circuit board 600, instead of the plurality of build-up layers 300, can be manufactured.

Second Embodiment

Hereinafter, a second embodiment will be described in detail with reference to the drawings. A semiconductor device according to the second embodiment is different from the semiconductor device according to the first embodiment in a structure having a plurality of stacks.

Hereinafter, a method of manufacturing semiconductor devices 2a and 2b according to the second embodiment will be described with reference to FIGS. 8A to 9B. FIGS. 8A to 9B are cross-sectional views illustrating an example of a procedure of the method of manufacturing the semiconductor devices 2a and 2b according to the second embodiment.

Figure 8A:
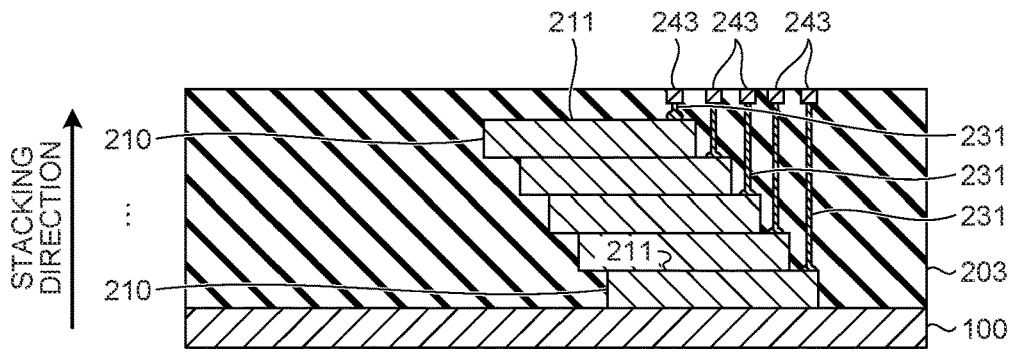
FIGS. 8A to 8C are cross-sectional views illustrating an example of a procedure of a method of manufacturing a semiconductor device according to a second embodiment.

FIG. 8A illustrates processing of forming a structure of the first stack of each of the semiconductor devices 2a and 2b (see FIGS. 9A and 9B) according to the second embodiment. The processing in FIG. 8A is substantially similar to the processing illustrated in FIGS. 3A to 3G of the first embodiment described above.

As illustrated in FIG. 8A, some semiconductor chips 210 included in the plurality of semiconductor chips 210 and 220 are sequentially stacked on the major surfaces 211 on one surface side so as not to overlap the electrodes 212 (see FIG. 1A) formed on the major surfaces 211.

The plurality of semiconductor chips 210 as a first group of semiconductor chips has some semiconductor chips 210 of the plurality of semiconductor chips 210 and 220 that will be included in the semiconductor devices 2a and 2b.

Each of the semiconductor chips 210 that will be included in the semiconductor devices 2a and 2b has a similar configuration to that of the semiconductor chip 210 of the first embodiment described above. In other words, each semiconductor chip 210 includes the electrode 212 (see FIG. 1A) and the nonvolatile memory on the major surface 211 on one surface side.

Note that the plurality of semiconductor chips 210 is sequentially stacked on the lead frame 100 in a manner similar to that of the plurality of semiconductor chips 210 of the first embodiment described above.

Furthermore, a plurality of wires 231 extending in the stacking direction of the semiconductor chips 210 from each electrode 212 of the plurality of semiconductor chips 210 stacked on the lead frame 100 is formed.

The plurality of wires 231 as a first group of wires is some of a plurality of wires that will be included in the semiconductor devices 2a and 2b. The plurality of wires 231 extending from the respective electrodes 212 of the semiconductor chips 210 extends substantially perpendicularly in the stacking direction of the semiconductor chips 210, similarly to the plurality of wires 230 included in the semiconductor device 1 according to the first embodiment.

Furthermore, the semiconductor chips 210 and the wires 231 are sealed with a sealing resin 203.

The sealing resin 203 as a first sealing resin is part of a sealing resin that will be included in the semiconductor devices 2a and 2b. Similarly to the sealing resin 200 of first embodiment described above, the sealing resin 203 is formed to cover the semiconductor chips 210 and the wires 231 so that the upper end portions of the wires 231 located at positions higher than the upper surfaces of the semiconductor chips 210 are buried.

Furthermore, similarly to the sealing resin 200 of the first embodiment described above, the sealing resin 203 is polished by a predetermined thickness, by the CMP method or the like.

In addition, a plurality of recesses (not illustrated) is formed at positions corresponding to the respective wires 231 of the plurality of wires 231 on a surface of the sealing resin 203 as a third surface in the stacking direction. This configuration exposes the end portions of the plurality of wires 231 from the bottom surfaces of the plurality of recesses.

The plurality of recesses as a first group of recesses is formed in the surface of the sealing resin 203 by, for example, photolithography and etching, similarly to the plurality of recesses 201 (see FIG. 3D) of the first embodiment described above. At this time, the etching depth is adjusted to expose the end portions of the plurality of wires 231 from the bottom surfaces of the recesses so as to be, for example, in any one of the states illustrated in FIGS. 2A to 2C of the first embodiment described above.

Furthermore, the plurality of recesses is filled with a metal material. Thus, a plurality of relay terminals 243 each connected to the end portion of each wire 231 of the plurality of wires 231 is formed. The relay terminal 243 is formed, for example, similarly to the terminal 240 of the first embodiment described above.

In other words, prior to filling the recess with the metal material, the barrier layer covering the inside of the recesses and the upper surface of the sealing resin 203 and mainly made of, for example, TiN or the like is formed. In addition, plating with a metal material such as Cu is performed to form the conductive layer covering the entire surface of the sealing resin 203. In addition, removing the conductive layer and the barrier layer on the surface of the sealing resin 203 by the CMP method or the like to form the relay terminals 243 arranged in the recesses via the barrier layer.

Furthermore, the touch-up polishing by the CMP method or the like is performed to expose the ends of the relay terminals 243 from the surface of the sealing resin 203 more reliably, while suppressing dishing or the like of the upper surfaces of the relay terminals 243.

Figure 8B:
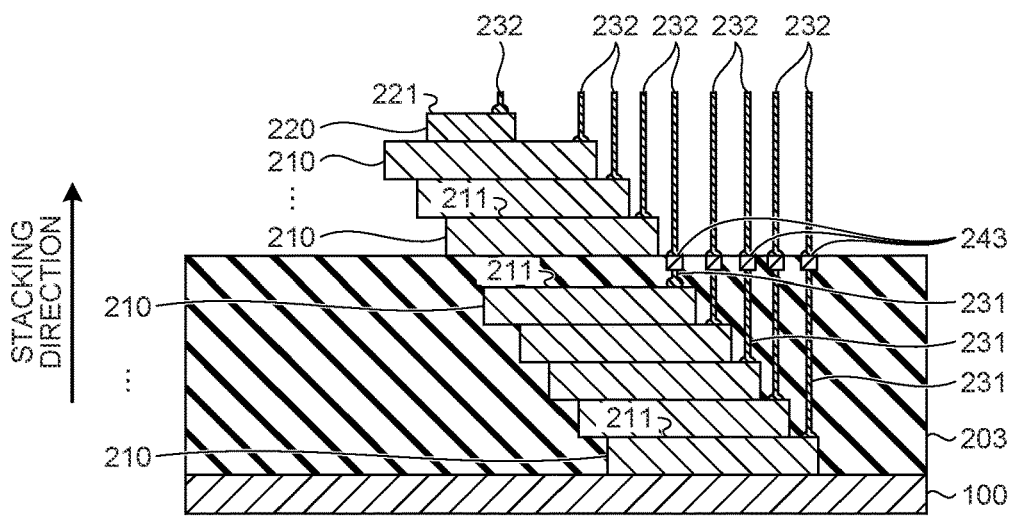
Figure 8C:
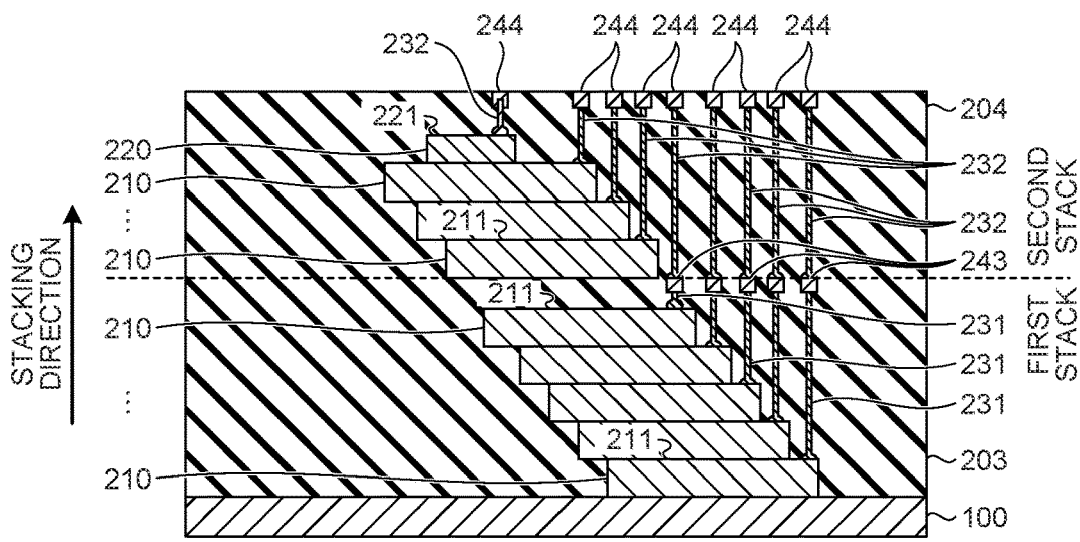

FIGS. 8B and 8C illustrate processing of forming a structure of the second stack of the semiconductor devices 2a and 2b according to the second embodiment. The processing in FIGS. 8B and 8C is also performed substantially similarly to the processing illustrated in FIGS. 3A to 3G of the first embodiment described above.

As illustrated in FIG. 8B, the remaining semiconductor chips 210 and 220 included in the plurality of semiconductor chips 210 and 220 are sequentially stacked on the surface of the sealing resin 203 so as not to overlap the electrodes 212 (see FIG. 1A) formed on the major surfaces 211 of the semiconductor chips 210.

The plurality of semiconductor chips 210 and 220 as a second group of semiconductor chips is the remaining semiconductor chips 210 and 220, excluding the semiconductor chips 210 having been already stacked, of the plurality of semiconductor chips 210 and 220 that will be included in the semiconductor devices 2a and 2b.

The semiconductor chip 220 included in the second group of semiconductor chips has a configuration similar to that of the semiconductor chip 220 of the first embodiment described above. In other words, the semiconductor chip 220 includes the electrode 222 (see FIG. 1A) and the logic circuit on the major surface 221 on one surface side.

Note that the semiconductor chip 220 is arranged on the uppermost surface of the plurality of semiconductor chips 210 in a manner similar to that of the semiconductor chip 220 of the first embodiment described above.

Furthermore, a plurality of wires 232 that extends, in the stacking direction of the plurality of semiconductor chips 210 and 220, from the respective electrodes 212 and 222 of the plurality of semiconductor chips 210 and 220 and further from the plurality of relay terminals 243 is formed.

The plurality of wires 232 as a second group of wires is some of the plurality of wires that will be included in the semiconductor devices 2a and 2b. In other words, the semiconductor devices 2a and 2b include the plurality of wires 231 and 232 as a whole. The plurality of wires 231 is connected to the plurality of wires 232 through the relay terminals 243 described above. In other words, the relay terminals 243 connect the plurality of wires 231 and 232 to each other and relay the wires 231 in a lower stack to the wires 232 in an upper stack. Out of the plurality of wires 232, the wires 232 connected to the semiconductor chips 210 and 220 in the upper stack are used alone without being connected to the plurality of wires 231.

As illustrated in FIG. 8C, the plurality of semiconductor chips 210 and 220 and the plurality of wires 232 in the upper stack are sealed with a sealing resin 204.

The sealing resin 204 as a second sealing resin is part of a sealing resin that will be included in the semiconductor devices 2a and 2b. In other words, the semiconductor devices 2a and 2b include the sealing resin 203 arranged for the lower stack and the sealing resin 204 arranged for the upper stack.

Similarly to the sealing resin 200 of the first embodiment described above, the sealing resin 204 is formed to cover the semiconductor chips 210 and 220 and the wires 232 so that the upper end portions of the wires 232 located at positions higher than the upper surfaces of the semiconductor chips 220 are buried.

Furthermore, similarly to the sealing resin 200 of the first embodiment described above, the sealing resin 204 is polished by a predetermined thickness, by the CMP method or the like.

In addition, a plurality of recesses (not illustrated) is formed at positions corresponding to the respective wires 232 of the plurality of wires 232 on a surface of the sealing resin 204 as the second surface in the stacking direction. This configuration exposes the end portions of the plurality of wires 232 from the bottom surfaces of the plurality recesses.

The plurality of recesses as a second group of recesses is formed in the surface of the sealing resin 204 by, for example, photolithography and etching, similarly to the plurality of recesses 201 (see FIG. 3D) of the first embodiment described above. At this time, the etching depth is adjusted to expose the end portions of the plurality of wires 232 from the bottom surfaces of the recesses so as to be, for example, in any one of the states illustrated in FIGS. 2A to 2C of the first embodiment described above.

Furthermore, the plurality of recesses is filled with a metal material. Thus, a plurality of terminals 244 connected to the end portion of each wire 232 of the plurality of wires 232 is formed. Each of the terminals 244 is formed, for example, similarly to the terminal 240 of the first embodiment described above.

In other words, prior to filling the recess with the metal material, the barrier layer covering the inside of the recesses and the upper surface of the sealing resin 204 and mainly made of, for example, TiN or the like is formed. In addition, plating with a metal material such as Cu is performed to form the conductive layer covering the entire surface of the sealing resin 204. In addition, removing the conductive layer and the barrier layer on the surface of the sealing resin 204 by the CMP method or the like to form the terminals 244 arranged in the recesses via the barrier layer.

Furthermore, the touch-up polishing by the CMP method or the like is performed to expose the ends of the terminals 244 from the surface of the sealing resin 204 more reliably, while suppressing dishing or the like of the upper surfaces of the terminals 244.

Figure 9A:
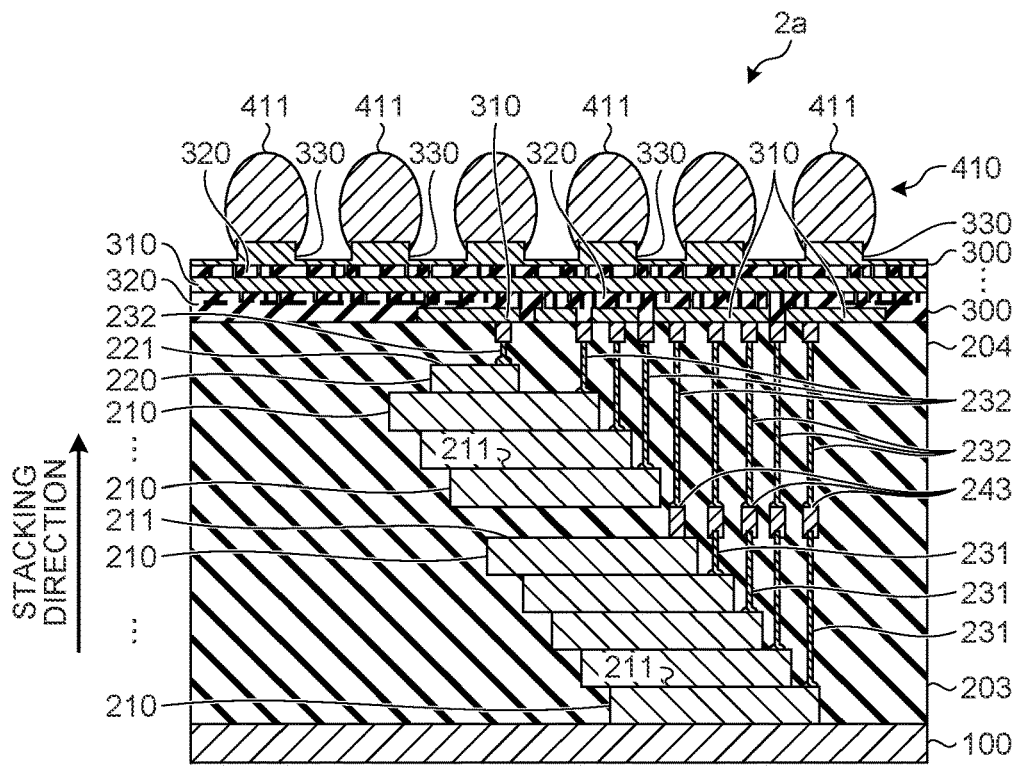
FIGS. 9A and 9B are cross-sectional views each illustrating an example of a procedure of the method of manufacturing the semiconductor device according to the second embodiment.
Figure 9B:
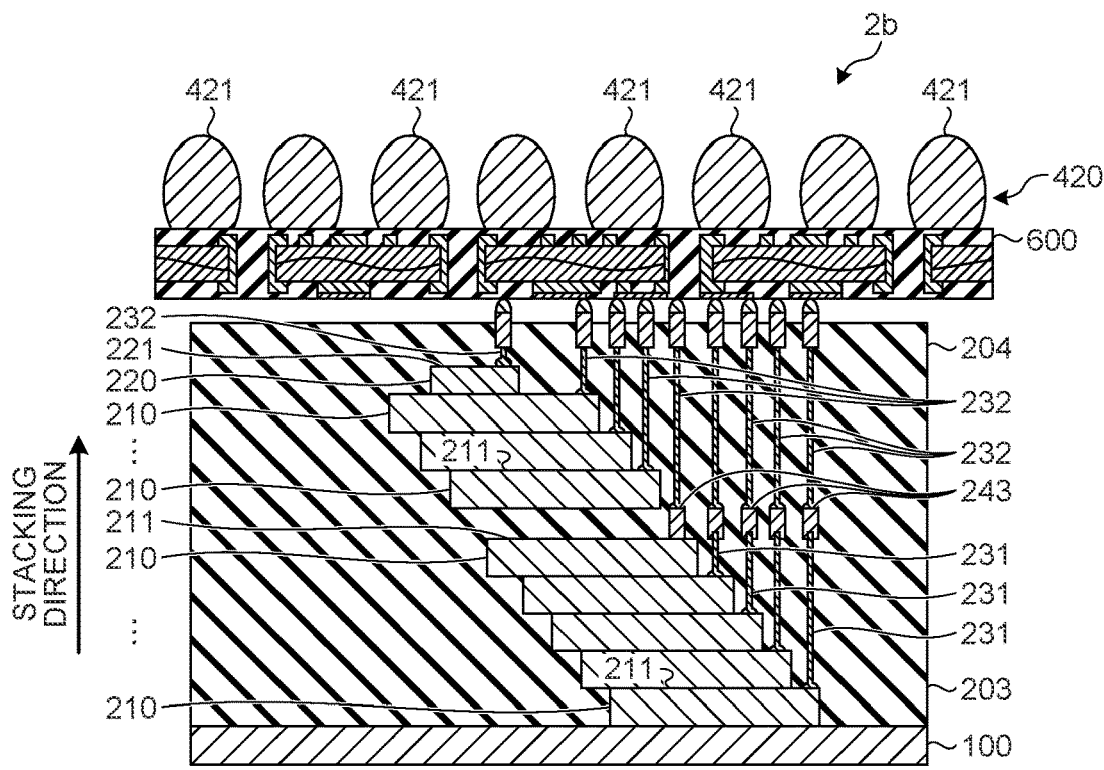

FIGS. 9A and 9B illustrate respectively a state in which the plurality of build-up layers 300 is formed on the upper surface of the sealing resin 204 to manufacture the semiconductor device 2a, and a state in which the printed circuit board 600 is arranged on the upper surface of the sealing resin 204 to manufacture the semiconductor device 2b.

As illustrated in FIG. 9A, the plurality of build-up layers 300 and the ball grid array 410 are formed, as in the semiconductor device 1 according to the first embodiment described above.

In other words, the redistribution layers 310 are connected to the terminals 244 exposed from the surface of the sealing resin 204. In other words, the lowermost build-up layer 300 including the redistribution layers 310 and the insulating layer 320 on which the redistribution layers 310 are arranged is formed.

Furthermore, the plurality of build-up layers 300 is stacked on the lowermost build-up layer 300. Still furthermore, the electrode pads 330 are formed on the surface of the uppermost build-up layer 300. Still another furthermore, the plurality of solder balls 411 connected to the electrode pads 330 is formed, and the ball grid array 410 including the plurality of solder balls 411 arranged in the grid pattern is formed.

As described above, the semiconductor device 2a according to the second embodiment is manufactured.

As illustrated in FIG. 9B, the printed circuit board 600 is arranged, and the ball grid array 420 is formed, as in the semiconductor device 1b according to the second modification of the first embodiment described above.

In other words, the plurality of bumps 261 connected to the terminals 244 exposed from the surface of the sealing resin 204 is formed.

Furthermore, the printed circuit board 600 is arranged on the surface side of the sealing resin 204 and connected to the plurality of bumps 261. In addition, the plurality of solder balls 421 is formed on the upper surface of the printed circuit board 600, and the ball grid array 420 including the plurality of solder balls 421 arranged in the grid pattern is formed.

As described above, the semiconductor device 2b according to the second embodiment is manufactured.

As described above, both of the semiconductor devices 2a and 2b according to the second embodiment include the following configuration.

In other words, the semiconductor devices 2a and 2b each include the plurality of semiconductor chips 210 as the first group of semiconductor chips, sequentially stacked on one another on the major surface 211 on one surface side, and the plurality of semiconductor chips 210 and 220 as the second group of semiconductor chips, sequentially stacked on one another on the major surface 211 on one surface side, the plurality of semiconductor chips 210 and 220 being closer to the surface of the sealing resin 204 than the semiconductor chips 210.

In addition, the semiconductor devices 2a and 2b each include the plurality of wires 231 as the first group of wires connected to the respective electrodes 212 and extending in the sealing resin 203 in the stacking direction of the semiconductor chips 210, and the plurality of wires 232 as the second group of wires extending in the sealing resin 204 to the vicinity of the surface of the sealing resin 204, in the stacking direction of the semiconductor chips 210 and 220, from a side closer to the surface of the sealing resin 204 than to the end positions of the wires 231 on the opposite side from the connection ends to the electrodes 212.

Furthermore, the semiconductor devices 2a and 2b each include the plurality of relay terminals 243 connecting between the respective wires 231 of the plurality of wires 231 and the respective wires 232 of the plurality of wires 232 corresponding to the respective wires 231 of the plurality of wires 231.

Here, the plurality of relay terminals 243 is arranged in the stacking direction of the semiconductor chips 210 and 220, between the plurality of semiconductor chips 210 arranged in the lower stack and the plurality of semiconductor chips 210 and 220 arranged in the upper stack. In addition, the plurality of relay terminals 243 is arranged at substantially the same position in the stacking direction of the semiconductor chips 210 and 220. In other words, the plurality of relay terminals 243 is at substantially the same height position in the horizontal direction.

Furthermore, the semiconductor devices 2a and 2b each include the plurality of terminals 244 that has one end portion buried in the sealing resin 204 and connected to each of the plurality of wires 232, and the other end portion exposed from the surface of the sealing resin 204.

The semiconductor devices 2a and 2b according to the second embodiment provide effects similar to those of the semiconductor device 1 according to the first embodiment described above.

The semiconductor devices 2a and 2b according to the second embodiment have the structure having the plurality of stacks. Thus, the respective wires 231 and 232 can be further shortened as compared with a case where the same number of semiconductor chips are arranged into a single stack. Therefore, the distortion of the respective wires 231 and 232 can be further suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a plurality of semiconductor chips which are stacked, each of the semiconductor chips having a first surface on which an electrode is formed;
a plurality of wires, each of the plurality of wires having a first end portion connected to a respective one of the electrodes of the plurality of semiconductor chips, and each of the plurality of wires extending in a stacking direction of the semiconductor chips;
a sealing resin that covers the plurality of semiconductor chips, that has a second surface in which a recess is formed, and that is formed so that the recess overlaps both the first end portion and a second end portion of each of the plurality of wires when viewed in the stacking direction; and
a plurality of terminals provided to fill the recess, a first end portion of each of the plurality of terminals being connected to the second end portion of a respective one of the plurality of wires, and a second end portion of each of the plurality of terminals being exposed from the sealing resin.

2. The semiconductor device according to claim 1, wherein the second end portion of each of the plurality of terminals is connected to a redistribution layer provided on a second surface side of the sealing resin.

3. The semiconductor device according to claim 1, further comprising a wiring board that is arranged on a second surface side of the sealing resin,
wherein the second end portion of each of the plurality of terminals is electrically connected to the wiring board.

4. The semiconductor device according to claim 1, wherein:
a metal-containing layer that is interposed between the sealing resin and the plurality of terminals is arranged at an interface between the sealing resin and the plurality of terminals, and
the metal-containing layer includes a metal material different from metal materials of the plurality of wires and the plurality of terminals.

5. The semiconductor device according to claim 4, wherein the metal-containing layer includes at least one of titanium (Ti), titanium nitride (TiN), tantalum (Ta), tantalum nitride TaN.

6. The semiconductor device according to claim 4, wherein:
a distance between the second end portion of each of the plurality of wires and the second end portion of a terminal to be connected thereto among the plurality of terminals is shorter than a distance between the first end portion and the second end portion of each of the plurality of terminals, and the metal-containing layer covers the second end portion of each of the plurality of wires.

7. The semiconductor device according to claim 4, wherein:
a distance between the second end portion of each of the plurality of wires and the second end portion of a terminal to be connected thereto among the plurality of terminals is shorter than a distance between the first end portion and the second end portion of each of the plurality of terminals; and
the metal-containing layer covers the second end portion of each of the plurality of terminals and does not cover the second end portion of each of the plurality of wires.

8. The semiconductor device according to claim 1, wherein the plurality of wires and the plurality of terminals include the same kind of metal material.

9. The semiconductor device according to claim 1, wherein the plurality of wires and the plurality of terminals include different kinds of metal materials.

10. The semiconductor device according to claim 1, wherein:
the plurality of wires includes a metal material of at least one of gold (Au), copper palladium (CuPd), copper (Cu), and silver (Ag), and
the plurality of terminals include a metal material of at least one of copper (Cu), nickel (Ni), tin (Sn), gold (Au), tungsten (W), and aluminum (Al).

11. The semiconductor device according to claim 1, wherein:
the plurality of semiconductor chips include a first group of semiconductor chips that are sequentially stacked, and a second group of semiconductor chips that are sequentially stacked on a closer side of the second surface of the sealing resin than the first group of semiconductor chips, and
the plurality of wires extending from the respective electrodes of the first group of semiconductor chips include (i) a first group of wires each of which has a first end portion connected to a respective one of the electrodes and extends in the sealing resin in the stacking direction of the semiconductor chips, (ii) a plurality of relay terminals each of which is buried in the sealing resin, has a first end portion connected to a second end portion of a respective one of the wires of the first group of wires, and extends in the stacking direction, and (ii) a second group of wires each of which has a first end portion connected to other a second end portion of a respective one of the plurality of relay terminals, extends in the stacking direction, and has a second end portion connected to the first end portion of a respective one of the plurality of terminals.

12. The semiconductor device according to claim 11, wherein the plurality of relay terminals are arranged between the first group of semiconductor chips and the second group of semiconductor chips, in the stacking direction.

13. The semiconductor device according to claim 11, wherein the plurality of relay terminals are arranged at substantially the same position in the stacking direction.

14. The semiconductor device according to claim 1, wherein the plurality of semiconductor chips include:
a semiconductor chip that has a nonvolatile memory; and
a semiconductor chip that has a logic circuit controlling the nonvolatile memory.

15. The semiconductor device according to claim 1, wherein the first end portion and the second end portion of each of the plurality of terminals have substantially same diameters.

16. The semiconductor device according to claim 1, wherein a distance between the second end portion of each of the plurality of wires and the second end portion of a terminal to be connected thereto among the plurality of terminals is shorter than a distance between the first end portion and the second end portion of each of the plurality of terminals.

* * * * *